(12) United States Patent
Tsukiyama et al.

(10) Patent No.: US 12,002,686 B2
(45) Date of Patent: Jun. 4, 2024

(54) SEMICONDUCTOR DEVICE AND METHOD OF MANUFACTURING THE SAME

(71) Applicant: KIOXIA CORPORATION, Tokyo (JP)

(72) Inventors: Satoshi Tsukiyama, Yokohama Kanagawa (JP); Satoru Takaku, Yokohama Kanagawa (JP); Yuki Sugo, Suzuka Mie (JP); Ayana Amano, Nagoya Aichi (JP)

(73) Assignee: KIOXIA CORPORATION, Tokyo (JP)

( * ) Notice: Subject to any disclaimer, the term of this patent is extended or adjusted under 35 U.S.C. 154(b) by 151 days.

(21) Appl. No.: 17/004,202

(22) Filed: Aug. 27, 2020

(65) Prior Publication Data
US 2021/0233781 A1 Jul. 29, 2021

(30) Foreign Application Priority Data
Jan. 27, 2020 (JP) .................................. 2020-011131

(51) Int. Cl.
*H01L 25/065* (2023.01)
*H01L 21/50* (2006.01)
(Continued)

(52) U.S. Cl.
CPC .............. *H01L 21/50* (2013.01); *H01L 23/16* (2013.01); *H01L 25/0657* (2013.01);
(Continued)

(58) Field of Classification Search
CPC ....... H01L 21/50; H01L 25/065; H01L 27/06; H01L 25/0657; H01L 25/043;
(Continued)

(56) References Cited

U.S. PATENT DOCUMENTS 9,953,933 B1 4/2018 Cadag et al.
2010/0055842 A1* 3/2010 Sugo ....................... H01L 24/83
438/118

(Continued)

FOREIGN PATENT DOCUMENTS

CN 101661909 A 3/2010
CN 104245874 A 12/2014
(Continued)

*Primary Examiner* — Younes Boulghassoul
*Assistant Examiner* — Quinton A Brasfield
(74) *Attorney, Agent, or Firm* — Foley & Lardner LLP (57) ABSTRACT

A semiconductor device includes a substrate, a first adhesive layer, a first semiconductor chip, and a second adhesive layer. The first adhesive layer is provided above a first surface of the substrate and includes a plurality of types of resins having different molecular weights and a filler. The first semiconductor chip is provided above the first adhesive layer. The second adhesive layer is provided in at least a part of a first region between the substrate and the first adhesive layer, and the second adhesive layer includes at least one type of resins among the plurality of types of resins having a molecular weight smaller than a molecular weight of other types of resins among the plurality of types of resins, and a filler having a lower concentration than that of the first adhesive layer.

11 Claims, 7 Drawing Sheets

(51) Int. Cl.
  *H01L 23/16*   (2006.01)
  *H01L 21/603*   (2006.01)
  *H01L 23/29*   (2006.01)
  *H01L 23/31*   (2006.01)
  *H01L 25/00*   (2006.01)

(52) U.S. Cl.
  CPC .......... *H01L 21/603* (2021.08); *H01L 23/295* (2013.01); *H01L 23/3142* (2013.01); *H01L 25/50* (2013.01)

(58) Field of Classification Search
  CPC . H01L 25/074; H01L 25/0756; H01L 25/117; H01L 2224/08145; H01L 23/16; H01L 23/295; H01L 23/3142; H01L 25/0652; H01L 25/071; H01L 25/112; H01L 27/0688; H01L 23/315; H01L 23/3135
  See application file for complete search history.

(56) References Cited

U.S. PATENT DOCUMENTS

| | | | |
|---|---|---|---|
| 2011/0052853 A1 | 3/2011 | Sugo et al. | |
| 2011/0316172 A1* | 12/2011 | Igarashi | H01L 23/3121 |
| | | | 257/777 |
| 2012/0153432 A1* | 6/2012 | Karakane | H01L 25/0657 |
| | | | 438/118 |
| 2015/0221587 A1* | 8/2015 | Kindo | H01L 24/49 |
| | | | 257/737 |
| 2015/0332986 A1* | 11/2015 | Tomohiro | H01L 25/0652 |
| | | | 257/737 |
| 2017/0025321 A1 | 1/2017 | Homma et al. | |
| 2017/0077390 A1* | 3/2017 | Otsuka | H01L 25/0657 |
| 2018/0108615 A1* | 4/2018 | Hsu | H01L 25/0657 |

FOREIGN PATENT DOCUMENTS

| | | |
|---|---|---|
| CN | 106373893 A | 2/2017 |
| JP | 3190702 B2 | 7/2001 |
| JP | 2004-238634 A | 8/2004 |
| JP | 2006-128169 A | 5/2006 |
| JP | 2011-071486 A | 4/2011 |
| JP | 2012-054363 A | 3/2012 |
| TW | 563214 B | 11/2003 |
| TW | 202003665 A | 1/2020 |

* cited by examiner

SEMICONDUCTOR DEVICE AND METHOD OF MANUFACTURING THE SAME

CROSS-REFERENCE TO RELATED APPLICATION(S)

This application is based upon and claims the benefit of priority from Japanese Patent Application No. 2020-011131, filed Jan. 27, 2020, the entire contents of which are incorporated herein by reference.

FIELD

Embodiments described herein relate generally to a semiconductor device and a method of manufacturing the same.

BACKGROUND

A method of stacking semiconductor chips by using a die attach film (DAF) in a packaging process of a semiconductor device is known. Generally, process conditions are set such that a front surface of a wiring substrate is filled with the DAF.

However, it is difficult to completely fill a gap between the wiring substrate and the DAF, and a cavity may occur in a package. Moisture (water vapor) in the cavity expands due to a high temperature in mounting reflow and moisture absorption reflow reliability tests, for example. Therefore, when the cavity is large, a pressure inside the cavity is high and the package may be damaged.

Examples of related art include JP-A-2004-238634.

DETAILED DESCRIPTION

At least one embodiment provides a semiconductor device and a method of manufacturing the same that can prevent damage during a heat treatment.

In general, according to at least one embodiment, a semiconductor device includes a substrate, a first adhesive layer (a first layer), a first semiconductor chip, and a second adhesive layer (a second layer). The first adhesive layer is provided above a first surface of the substrate and includes a plurality of types of resins having different molecular weights and a filler. The first semiconductor chip is provided above the first adhesive layer. The second adhesive layer is provided in at least a part of a first region between the substrate and the first adhesive layer. The second adhesive layer includes at least one type of resins among the plurality of types of resins having a molecular weight smaller than a molecular weight of other types of resins among the plurality of types of resins, and a filler having a lower concentration than the filler of the first adhesive layer.

Hereinafter, embodiments of the present disclosure will be described with reference to the drawings. The embodiments do not limit the present disclosure. In the following embodiments, an upper-lower direction of a semiconductor substrate indicates a relative direction when a surface on which a semiconductor element is provided was directed upward, and may be different from an upper-lower direction corresponding to a gravitational acceleration. The drawings are schematic or conceptual, and a ratio of each portion or the like is not necessarily the same as an actual one. In the description and the drawings, the same reference numerals are given to elements similar to those described above with reference to the previous drawings, and a detailed description is omitted as appropriate.

First Embodiment

Figure 1:
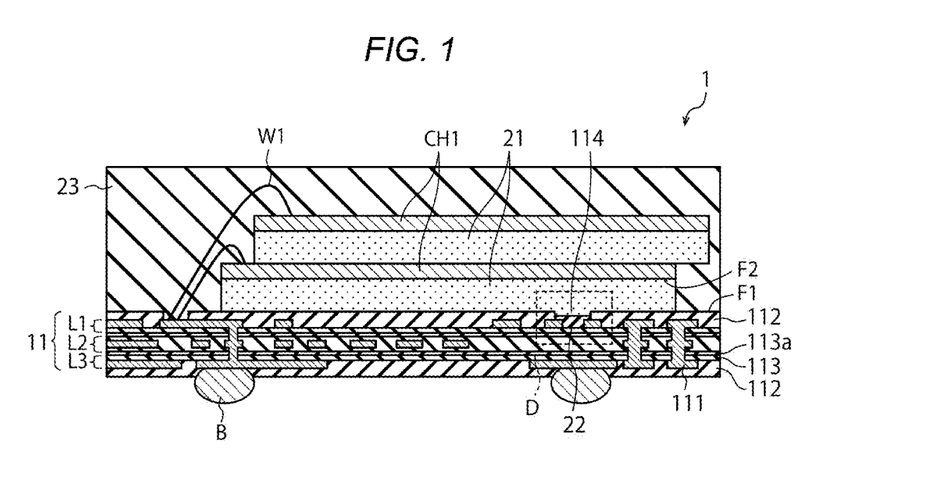
FIG. 1 is a cross-sectional view showing an arrangement of a semiconductor device according to a first embodiment.

FIG. 1 is a cross-sectional view showing an arrangement of a semiconductor device 1 according to a first embodiment. The semiconductor device 1 includes a wiring substrate 11, adhesive layers 21, semiconductor chips CH1, wires W1, an adhesive layer 22, a resin 23, and metal bumps B.

In an example shown in FIG. 1, the semiconductor chips CH1 are stacked in a vertical direction in two stages via the adhesive layers 21. The vertical direction is substantially perpendicular to a substrate upper surface F1 of the wiring substrate 11. However, the number of staked layers of the semiconductor chips CH1 is not limited to two and may be changed optionally.

The wiring substrate 11 includes a wiring 111 and resin layers 112 and 113. The wiring substrate 11 is a substrate such as a printed substrate. A type of the substrate is not limited as long as the wiring substrate 11 can be connected to the semiconductor chips CH1 via the wires W1. The wiring substrate 11 may be, for example, a silicon substrate or the like.

The wiring 111 electrically connects an electrode pad (not shown) on the substrate upper surface F1 of the wiring substrate 11 and the metal bumps B on a substrate lower surface of the wiring substrate 11. For the wiring 111, for example, a conductive metal such as copper or tungsten is used. The wiring 111 includes a plurality of wiring layers L1 to L3 that were stacked. The wiring layers L1 to L3 are insulated by the resin layers between layers. In addition, the wiring layers L1 to L3 may be partially electrically connected by, for example, via holes or the like.

For the resin layer 112, for example, an insulating material such as a solder resist is used. The resin layer 113 includes a reinforcing portion 113a and has higher strength and rigidity than the resin layer 112. The resin layer 113 is, for example, a prepreg. The reinforcing portion 113a is, for example, a fibrous reinforcing material such as glass cloth.

In addition, the wiring substrate 11 is provided with a recess 114. Details of the recess 114 will be described later with reference to FIG. 2.

The adhesive layer 21 is provided above the substrate upper surface F1 of the wiring substrate 11. In addition, the adhesive layer 21 includes a plurality of types of resins having different molecular weights and a filler. The adhesive layer 21 is, for example, a film-shaped resin (die attach film (DAF)). In addition, the filler is, for example, a silica filler.

In addition, more specifically, the adhesive layer 21 includes at least one of acrylic rubber and polyimide, and at least one of an epoxy resin and a phenol resin. Molecular weights of the acrylic rubber and the polyimide are larger than those of the epoxy resin and the phenol resin. The molecular weight of the acrylic rubber is, for example, 400,000 to 1,000,000. The molecular weight of the polyimide is, for example, 50,000 to 300,000, and more preferably 70,000 to 200,000. The molecular weights of the epoxy resin and the phenol resin each are, for example, 1000 to 3000. In addition, a compounding ratio of the adhesive layer 21 is set such that desired characteristics such as fluidity and elastic modulus in an uncured state can be obtained, for example. The compounding ratio of the adhesive layer 21 is, for example, about 50 wt % of the filler, about 10 wt % to about 25 wt % of the acrylic rubber, about 5 wt % to about 20 wt % of the epoxy resin, and about 5 wt % to about 20 wt % of the phenol resin. A part of the acrylic rubber may be the polyimide.

The semiconductor chips CH1 are provided above the adhesive layers 21. More specifically, the semiconductor chip CH1 is adhered to the wiring substrate 11 or another semiconductor chip CH1 by the adhesive layer 21. The number of the stacked layers of the semiconductor chips CH1 may be, for example, in a range of 1 to 16 stages. In addition, the semiconductor chips CH1 are shifted in a staircase manner and stacked as shown in FIG. 1. Accordingly, it is possible to prevent the semiconductor chip CH1 from overlapping the electrode pad (not shown) of another semiconductor chip CH1 and to connect the wires W1 to the electrode pads of respective semiconductor chips CH1. The semiconductor chips CH1 may be, for example, memory chips having the same configuration, respectively. The memory chip may be, for example, a NAND chip. The number of the stacked layers of the semiconductor chips CH1 is set according to a required memory capacity.

The wires W1 electrically connect the wiring substrate 11 and the semiconductor chips CH1. For the wire W1, for example, a conductive metal such as gold is used. For the wire W1, for example, silver, copper, or the like may be used.

The adhesive layer 22 is provided in at least a part of a region between the wiring substrate 11 and the adhesive layer 21. More specifically, as shown in FIG. 1, the adhesive layer 22 is provided in a region between the recess 114 of the wiring substrate 11 and the adhesive layer 21. As to be described later, the adhesive layer 22 is formed so as to fill a gap (a cavity) between the wiring substrate 11 and the adhesive layer 21. The cavity has a high pressure due to high temperature processing such as a moisture absorption reflow and amounting reflow. Therefore, by filling (decreasing) the cavity, damage to a package due to a pressure during a heat treatment can be prevented. The adhesive layer 22 exudes from the adhesive layer 21 and is separated from the adhesive layer 21 in a process of manufacturing. Details of forming the adhesive layer 22 will be described later with reference to FIGS. 3 to 5.

Figure 2:
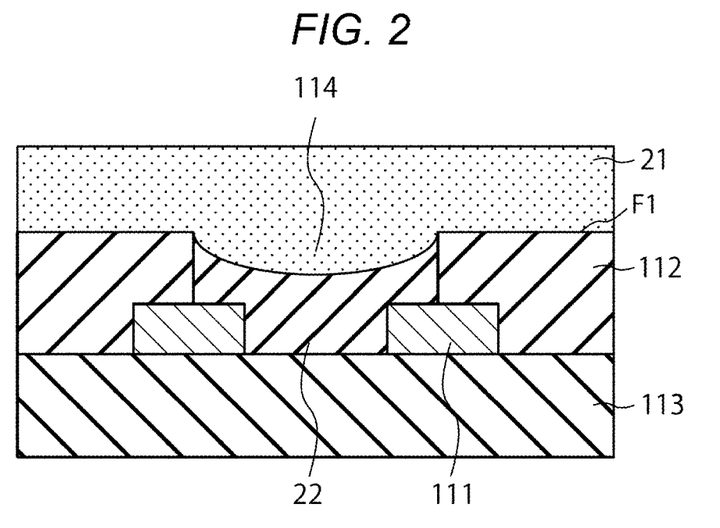
FIG. 2 is an enlarged view of an adhesive layer according to the first embodiment.

FIG. 2 is an enlarged view of the adhesive layer 22 according to the first embodiment. FIG. 2 is also an enlarged view of a dotted frame D in FIG. 1. In addition, in FIG. 2, the reinforcing portion 113a is omitted.

The recess 114 is, for example, an etch-back opening. The etch-back opening is an opening for disconnecting or removing an extra lead wire when the wiring 111 is provided by plating. The etch-back opening is likely to be a deep recess, and a large gap is likely to occur between the etch-back opening and the adhesive layer 21.

A part of the adhesive layer 21 extends downward in the recess 114. In addition, a shape of a boundary between the adhesive layer 21 and the adhesive layer 22 is convex downward. This is because when the semiconductor chip CH1 is adhered to the wiring substrate 11, the adhesive layer 21 is pressed by a pressure from above. Therefore, a maximum height of the adhesive layer 22 is less than or equal to a height of the resin layer 112 on the substrate upper surface F1. In addition, the maximum height of the adhesive layer 22 is also lower than or equal to a height of an opening edge of the recess 114.

In addition, the adhesive layer 22 includes at least one type of the resins having a molecular weight smaller than those of other types of the resins among the plurality of types of resins and a filler having a lower concentration than that of the adhesive layer 21. That is, among the resins contained in the adhesive layer 21, a part of the resins having small molecular weights are separated as the adhesive layer 22. The "filler having a lower concentration" includes a case where no filler exists (0 wt %) in the adhesive layer 22.

In addition, more specifically, the adhesive layer 22 includes at least one of the epoxy resin or the phenol resin. That is, the adhesive layer 22 includes the resins having small molecular weights, but does not include resins having large molecular weights such as the acrylic rubber and the polyimide. Therefore, at least one of the acrylic rubber or the polyimide remains in the adhesive layer 21. In addition, the epoxy resin and the phenol resin are less likely to be hydrolyzed than the acrylic rubber. Therefore, by including the epoxy resin or the phenol resin in the adhesive layer 22, it is possible to prevent deterioration of an insulating performance of the resins due to a migration of a metal in the wiring 111, for example. In addition, an evaluation in a high temperature and high humidity bias test can be improved.

As shown in FIG. 1, the resin 23 seals the semiconductor chips CH1, the adhesive layers 21, and the wires W1 on the substrate upper surface F1. Accordingly, the resin 23 protects the semiconductor chips CH1, the adhesive layers 21, and the wires W1 from an external impact or outside air. For the resin 23, for example, an epoxy resin or the like is used. In addition, the resin 23 may include a filler.

The metal bumps B are provided on the substrate lower surface of the wiring substrate 11 opposite to the substrate upper surface F1 and are connected to apart of the wiring layer L3. The metal bumps B electrically connects the semiconductor device 1 to an external mounting substrate (not shown) or the like. For the metal bump B, for example, a conductive metal such as solder is used. In this case, the metal bumps B may be, for example, solder balls.

Next, a method of manufacturing the semiconductor device 1 will be described. Hereinafter, an assembly process after a wafer process will be described.

Figure 3:
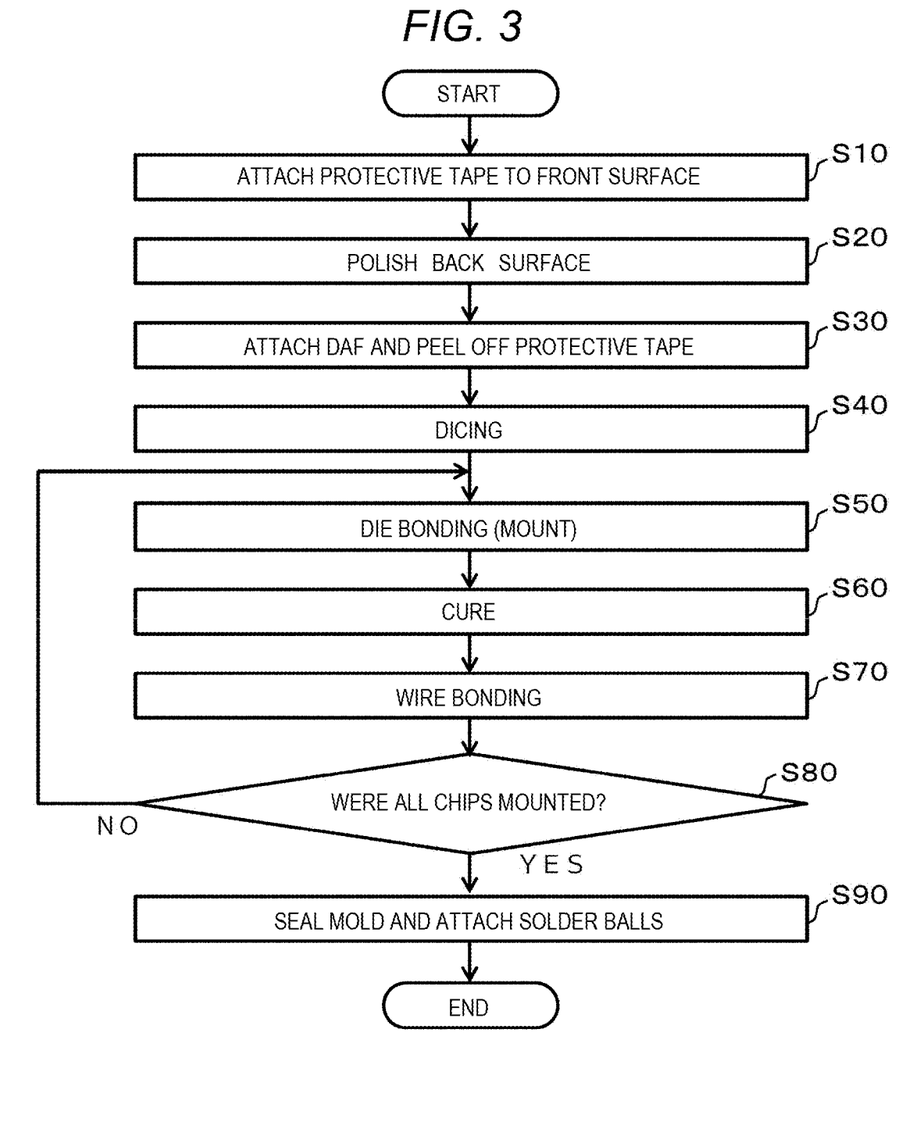
FIG. 3 is a flowchart showing a method of manufacturing the semiconductor device according to the first embodiment.

FIG. 3 is a flowchart showing the method of manufacturing the semiconductor device 1 according to the first embodiment. Hereinafter, the adhesive layer 21 may be referred to as the DAF.

First, a protective tape is attached to a front surface (an upper surface) of a wafer (S10). Next, a back surface (a lower surface) of the wafer is polished such that a wafer thickness is brought to a desired thickness (S20). Next, a dicing tape with the DAF is attached to the lower surface of the wafer, and the protective tape is peeled off (S30). Next, the wafer is cut into individual semiconductor chips CH1 by a blade (S40). That is, the adhesive layer 21 (a film-shaped resin) including the plurality of resins having different molecular weights and the filler is provided on a chip lower surface F2 (the lower surface of the wafer) of the semiconductor chip CH1 (wafer) so as to face the substrate upper surface F1 of the wiring substrate 11.

Next, the semiconductor chip CH1 is adhered (mounted) on the wiring substrate 11 (S50). That is, the semiconductor chip CH1 is provided on the substrate upper surface F1 via the adhesive layer 21. As conditions for mounting, for example, a temperature is about 70° C. to about 150° C., and a pressure is about 0.1 MPa to about 0.5 MPa, more preferably about 0.2 MPa to about 0.4 MPa. For example, the DAF has a large decrease in the elastic modulus and is soft at about 70° C. to about 150° C. Next, the DAF is cured and outgas is discharged (S60). That is, due to a pressurization of the adhesive layer 21, the adhesive layer 22 is formed in the gap between the wiring substrate 11 and the adhesive layer 21. As conditions for curing, for example, the temperature is about 100° C. to about 200° C., and the pressure is about 0.5 MPa or more, more preferably about 0.9 MPa or more. The filling property of the adhesive layers 21 is improved as the pressure increases. Therefore, more preferably, the pressure is high. In addition, as the conditions for curing, a treatment time is about 30 minutes to about 2 hours.

In addition, more specifically, the adhesive layer 22 is formed by at least one of installation of the semiconductor chip CH1 on the wiring substrate 11 and a curing treatment of the adhesive layer 21. That is, the adhesive layer 22 can be formed by the pressurization to the adhesive layer 21 during both mounting and curing. Since a higher pressure is applied during curing than during mounting, the adhesive layer 22 may be readily formed. Details of the adhesive layer 22 from the mounting to the curing will be described later with reference to FIGS. 4 and 5.

Next, electrodes on the semiconductor chip CH1 and the wiring substrate 11 are connected by the wire W1 (S70). When not all the semiconductor chips CH1 are mounted (NO in S80), steps S50 to S70 are executed again. In step S50 of a second time or more, the semiconductor chip CH1 is adhered to another semiconductor chip CH1 that was already mounted. Therefore, a required number of semiconductor chips CH1 are stacked on the wiring substrate 11. When all the semiconductor chips CH1 were mounted (YES in S80), the wiring substrate 11 is disposed in a mold and the mold is filled with the resin 23, and the metal bumps B are mounted on the electrodes on the substrate lower surface of the wiring substrate 11 (S90).

Figure 4:
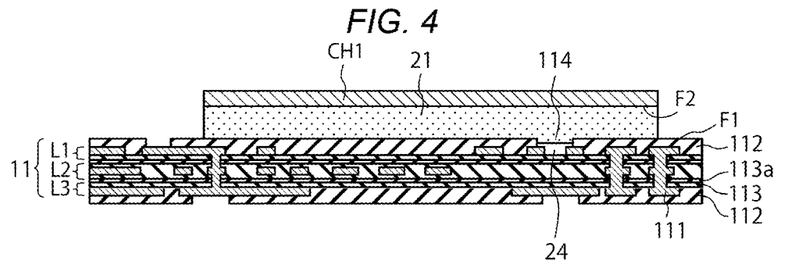
FIG. 4 is a cross-sectional view showing an example of the semiconductor device in a process of manufacturing at an initial stage of mounting.
Figure 5:
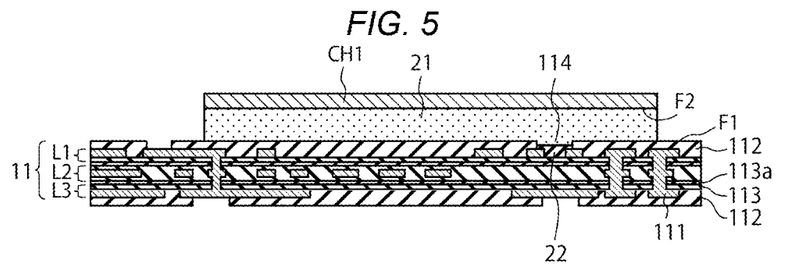
FIG. 5 is a cross-sectional view showing an example of the semiconductor device in the process of manufacturing from a stage during mounting to a stage after curing.

FIG. 4 is a cross-sectional view showing an example of the configuration of the semiconductor device 1 in a process of manufacturing at an initial stage of mounting. FIG. 5 is a cross-sectional view showing an example of the configuration of the semiconductor device 1 in the process of manufacturing from a stage during mounting to a stage after curing.

As shown in FIG. 4, in the initial stage of mounting, a gap 24 exists in the recess 114. This is because it is difficult to completely fill the inside of the recess 114 with the adhesive layer 21. As shown in FIGS. 4 and 5, during mounting or curing, due to the pressurization to the adhesive layer 21, the adhesive layer 22 is formed in the gap 24 between the recess 114 of the wiring substrate 11 and the adhesive layer 21. Due to heat during mounting and curing, fluidity of the resins (for example, the epoxy resin and the phenol resin) having small molecular weights increases. The resins having small molecular weights exude from the adhesive layer 21 due to the pressure and are separated as the adhesive layer 22. When the recess 114 is the etch-back opening, an area of the gap 24 is, for example, about 100 μm square to about 200 μm square. A shape of the gap 24 may be any shape such as several 100 μm·about 5 mm. In addition, a depth of the gap 24 is, for example, about 10 μm.

In addition, among the plurality of types of resins having different molecular weights, a ratio of a minimum value to a maximum value of the molecular weight is equal to or less than a predetermined value. The predetermined value is, for example, 1/10 or less, and more preferably 1/1000 to 1/100. The larger a difference in the molecular weights of the resins in the adhesive layer 21, the easier the resins having small molecular weights exude from the adhesive layer 21 and are separated. For example, the acrylic rubber has a large molecular weight and molecules are strongly entangled with each other due to a continuous molecular shape, so that the acrylic rubber maintains a film shape. Therefore, each molecule of the acrylic rubber is difficult to move. For example, the epoxy resin has a smaller molecular weight than the acrylic rubber, and readily readily passes through gaps of mesh-shape molecules of the acrylic rubber. Therefore, the epoxy resin can be separated from the adhesive layer 21 due to the pressure. In addition, a particle size of the filler is large, for example, about several μm. In addition, the filler is strongly bonded to the resins in the adhesive layer 21 by silane coupling or the like. Therefore, the filler is readily caught by the mesh-shaped molecules of the acrylic rubber and is difficult to pass through the gaps of the molecules.

In addition, the smaller the molecular weights of the resins to be separated, the easier the front surface of the wiring substrate 11 can be filled.

As described above, according to the first embodiment, the adhesive layer 21 includes plurality of types of resins having different molecular weights and the filler. In addition, the adhesive layer 22 is provided in at least a part of a region between the wiring substrate 11 and the adhesive layer 21, and includes at least one type of the resins having a small molecular weight among the plurality of types of resins and the filler having a lower concentration than that of the adhesive layer 21.

Generally, process conditions are set such that the front surface of the wiring substrate 11 is filled with the adhesive layer 21 during mounting and curing. However, it is difficult to completely fill the gap between the wiring substrate 11 and the adhesive layer 21, and the cavity may occur in the package. Moisture (water vapor) in the cavity expands due to a high temperature in amounting reflow or moisture absorption reflow reliability test, for example. The mounting reflow is a heat treatment for melting the metal bumps B at a high temperature of about 260° C. or higher and electrically connecting the semiconductor device 1 and the mounting substrate. In addition, the moisture absorption reflow reliability test is a reliability test in which the heat treatment is performed in a state where the package intentionally includes water. Therefore, when the cavity is large, the pressure inside the cavity is high and the package may be damaged by an explosion of water vapor under high pressure. The damage of the package includes, for example, peeling of the resin 23 from the semiconductor chips CH1, occurrence of cracks in the resin 23, or the like.

In the first embodiment, by separating the resins having small molecular weights and forming the adhesive layer 21 in the cavity, the cavity can be made small or the cavity can be filled. As a result, the damage to the package during the heat treatment can be prevented, thereby improving reliability. An effect of cavities in the adhesive layer 21 generated due to the separation of the resins is small.

In addition, in the first embodiment, the gap 24 is filled by at least one of the mounting or the curing. Therefore, the gap 24 can be filled (reduced) without increasing the number of processes. In addition, the maximum height of the adhesive layer 22 is less than or equal to the height of the resin layer 112 on the substrate upper surface F1.

A part of the resins in the adhesive layer 21 may have a reactive functional group such as a carboxyl group and an epoxy group. That is, the adhesive layer 21 including the acrylic rubber to which the reactive functional group was previously attached may be used. Accordingly, across-linking reaction of the acrylic rubber readily proceeds, and the difference in the molecular weights of the resins in the adhesive layer 21 increases. As a result, the adhesive layer 22 is readily separated from the adhesive layer 21, and the gap 24 can be further filled (further reduced).

Second Embodiment

Figure 6:
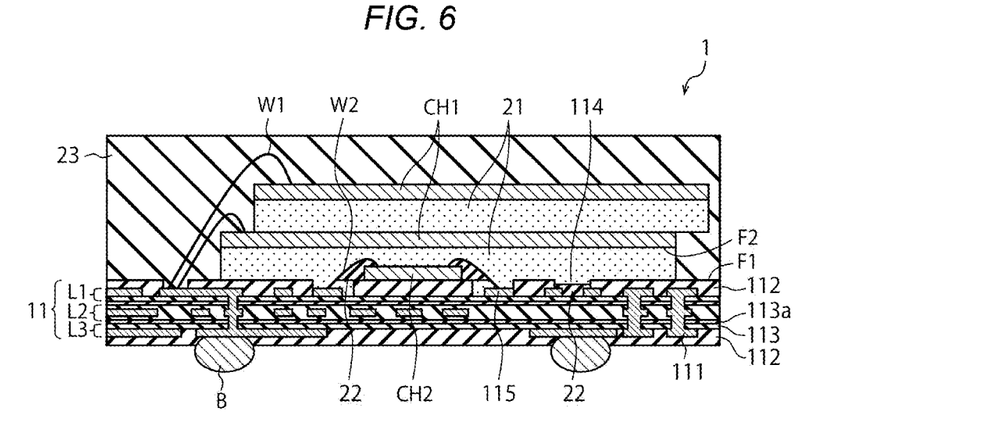
FIG. 6 is a cross-sectional view showing an arrangement of a semiconductor device according to a second embodiment.

FIG. 6 is a cross-sectional view showing a configuration of a semiconductor device 1 according to a second embodiment. The second embodiment is different from the first embodiment in that a semiconductor chip CH2 is provided.

The semiconductor device 1 further includes the semiconductor chip CH2, and wires W2.

The semiconductor chip CH2 is provided between the wiring substrate 11 and the adhesive layer 21. The semiconductor chip CH2 is provided below the semiconductor chip CH1 and is covered with the adhesive layer 21. The semiconductor chip CH2 is, for example, a controller chip. In this case, the semiconductor chip CH2 controls an operation of the semiconductor chips CH1.

The wires W2 electrically connect the wiring substrate 11 and the semiconductor chip CH2. The wiring substrate 11 further includes bonding pads 115 connected to the wires W2. Therefore, more specifically, the wires W2 electrically connect the bonding pads 115 and the semiconductor chip CH2. In addition, the adhesive layer 21 is provided above the wires W2. For the wire W2, for example, a conductive metal such as gold is used. For the wire W2, for example, silver, copper, or the like may be used.

Since the wires W2 are resistances, the adhesive layer 21 is difficult to enter below the wires W2. Therefore, a large gap readily occurs below the wires W2, similarly to the recess 114. Apart of the adhesive layer 21 may exist below the wires W2. This is because, for example, apart of the adhesive layer 21 may enter from arches at ends of the plurality of wires W2 provided in a direction perpendicular to a paper surface of FIG. 8. A position of the part of the adhesive layer 21 that enters is not limited to an example shown in FIG. 8, and may be any position between the wires W2 and at least one of the wiring substrate 11 or the semiconductor chip CH2 below the wires W2.

The adhesive layer 22 is provided in a region between the wires W2 and at least one of the wiring substrate 11, the adhesive layer 21, and the semiconductor chip CH2 below the wires W2. As to be described later, the adhesive layer 22 is formed so as to fill the gaps below the wires W2.

Therefore, the maximum height of the adhesive layer 22 is lower than or equal to a height of the wire W2.

Other configurations of the semiconductor device 1 according to the second embodiment are similar to corresponding configurations of the semiconductor device 1 according to the first embodiment, so that detailed descriptions thereof will be omitted. In an example shown in FIG. 6, the recess 114 and the adhesive layer 22 in the recess 114 are shown as in FIG. 1 in the first embodiment. However, the second embodiment is not limited to a case where the recess 114 is provided.

Figure 7:
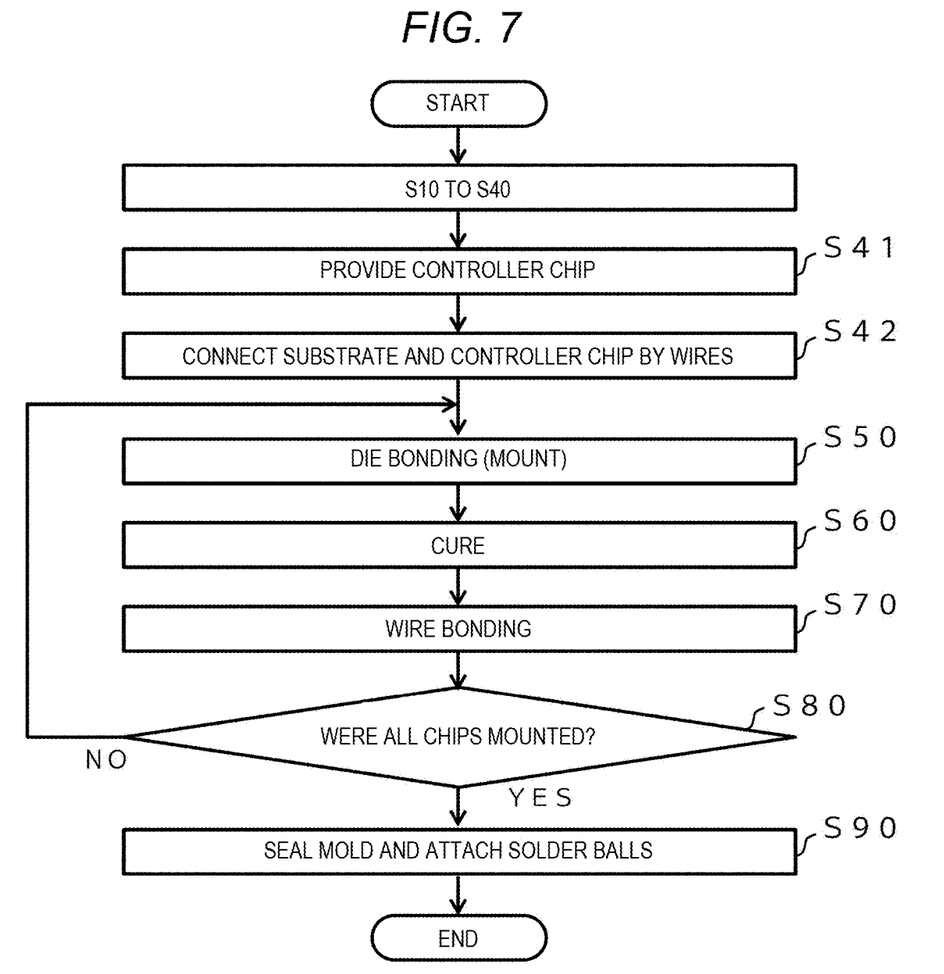
FIG. 7 is a flowchart showing a method of manufacturing the semiconductor device according to the second embodiment.

FIG. 7 is a flowchart showing a method of manufacturing the semiconductor device 1 according to the second embodiment. Steps S10 to S40 are similar to those in the flowchart of FIG. 3 in the first embodiment.

After step S40, the semiconductor chip CH2 is provided on the wiring substrate 11 (S41). The semiconductor chip CH2 is adhered to the wiring substrate 11 by, for example, the adhesive layer (not shown). Next, the wiring substrate 11 and the semiconductor chip CH2 are connected by the wires W2 (S42). That is, before the semiconductor chip CH1 is provided on the substrate upper surface F1, the semiconductor chip CH2 is provided on the substrate upper surface F1 and the wiring substrate 11 and the semiconductor chip CH2 are electrically connected by the wires W2. Then, step S50 is executed.

Steps S50 to S90 are similar to those in the flowchart of FIG. 3 in the first embodiment. Steps S41 and S42 are not limited to an order shown in FIG. 7. For example, steps S41 and S42 may be executed in parallel with steps S10 to S40.

Figure 8:
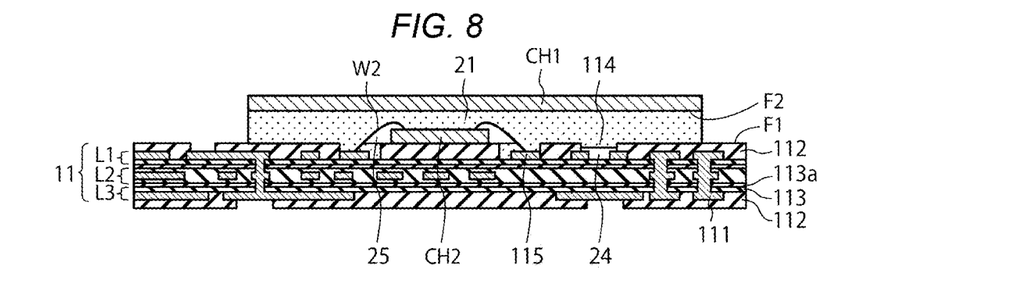
FIG. 8 is a cross-sectional view showing an example of the semiconductor device in the process of manufacturing at an initial stage of mounting.
Figure 9:
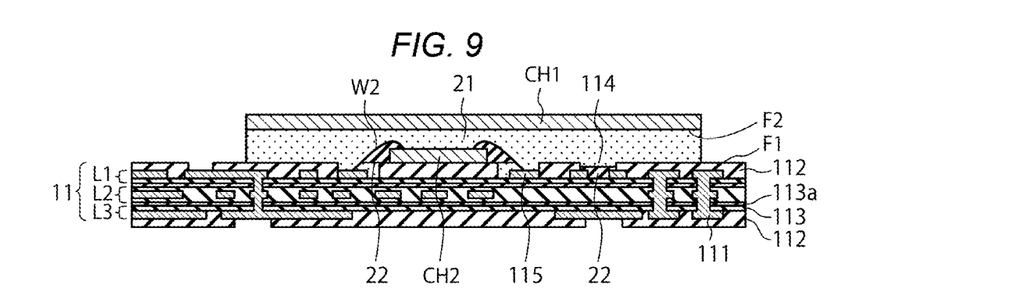
FIG. 9 is a cross-sectional view showing an example of the semiconductor device in the process of manufacturing from a stage during mounting to a stage after curing.

FIG. 8 is a cross-sectional view showing an example of the configuration of the semiconductor device 1 in a process of manufacturing at an initial stage of mounting. FIG. 9 is a cross-sectional view showing an example of the configuration of the semiconductor device 1 in the process of manufacturing from a stage during mounting to a stage after curing.

As shown in FIG. 8, in the initial stage of mounting, gaps 25 exist below the wires W2. As shown in FIGS. 8 and 9, during mounting or curing, due to pressurization of the adhesive layer 21, the adhesive layer 22 is formed in the gaps 25 between the wires W2 and at least one of the wiring substrate 11, the adhesive layer 21, and the semiconductor chip CH2 below the wires W2.

The semiconductor device 1 according to the second embodiment can obtain effects similar to those of the first embodiment.

Additional Embodiments

In the first and second embodiments, the adhesive layer 21 may be a liquid or paste adhesive layer 21 instead of a film. In the manufacturing method at this time, first, the liquid or paste adhesive layer 21 is applied above the substrate upper surface F1 of the wiring substrate 11 by various methods such as potting, screen printing, and inkjet. Then, the semiconductor chip CH1 is mounted on the wiring substrate 11 via the adhesive layer 21 and cured. That is, the adhesive layer 21 is provided on the substrate upper surface F1, and the chip lower surface F2 of the semiconductor chip CH1 is provided on the substrate upper surface F1 so as to face the substrate upper surface F1 via the adhesive layers 21. As described above, even when the liquid or paste adhesive layer 21 is used, the adhesive layer 22 can be separated into the gaps 24 and 25, and the effects similar to those of the first and second embodiments can be obtained.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
   a substrate;
   a first resin layer provided above a first surface of the substrate, the first resin layer including a plurality of types of resins having different molecular weights and a filler;
   a first semiconductor chip provided above the first resin layer and the first surface; and
   a second resin layer provided in at least a part of a first region between the substrate and the first resin layer, the second resin layer directly contacting the first resin layer, the second resin layer including:
   at least one type of resins among the plurality of types of resins having a molecular weight smaller than a molecular weight of other types of resins among the plurality of types of resins, and
   a filler having a lower concentration than the filler of the first resin layer,
   a third resin layer covering the first resin layer, the second resin layer and the substrate,
   wherein
   the third resin layer directly contacting the first surface of the substrate,
   the first semiconductor chip directly contacting the first resin layer,
   the substrate includes a recess, and the second resin layer is disposed in a second region between the recess and the first resin layer,
   the recess has a first metal film and a second metal film, and the first and second metals are physically separated in the recess,
   a first part of the first metal film and a first part of the second metal film directly contacting a bottom surface of the recess,
   a second part of the first metal film and a second part of the second metal film being embedded in a side wall of the recess.

2. The semiconductor device according to claim 1, further comprising:
   a second semiconductor chip disposed between the substrate and the first resin layer; and
   a wire electrically connecting the substrate and the second semiconductor chip, wherein
   the second resin layer is provided in a third region between the wire and at least one of the substrate, the first resin layer or the second semiconductor chip is below the wire.

3. The semiconductor device according to claim 2, wherein the third region includes a gap formed by the wire and filled by the second resin layer.

4. The semiconductor device according to claim 1, wherein among the plurality of types of resins having different molecular weights, a ratio of a minimum value to a maximum value of the molecular weights is equal to or less than a predetermined value.

5. The semiconductor device according to claim 4, wherein the predetermined value is $1/10$ or less.

6. The semiconductor device according to claim 5, wherein the predetermined value is between $1/100$ and $1/1000$.

7. The semiconductor device according to claim 1, wherein
   the first resin layer includes at least one of acrylic rubber or polyimide, and at least one of an epoxy resin or a phenol resin, and
   the second resin layer includes at least one of the epoxy resin or the phenol resin.

8. The semiconductor device according to claim 1, wherein the filler comprises silica.

9. The semiconductor device according to claim 1, wherein a top surface of the second resin layer is lower than a top edge of the recess.

10. The semiconductor device according to claim 1, wherein the second resin layer is convex in the recess.

11. A semiconductor device, comprising:
    a substrate including a recess;
    a first resin layer provided above a first surface of the substrate, the first resin layer including a filler;
    a first semiconductor chip provided above the first resin layer; and
    a second resin layer provided in the recess, the second resin layer directly contacting the first resin layer, and the second resin layer includes a filler having a lower concentration than the filler of the first resin layer,
    wherein the recess has a first metal film and a second metal film, and the first and second metal films are physically separated in the recess,
    the second resin layer is disposed in a second region between the recess and the first resin layer,
    a first part of the first metal film and a first part of the second metal film directly contacting a bottom surface of the recess,
    a second part of the first metal film and a second part of the second metal film being embedded in a side wall of the recess.

* * * * *